United States Patent
Rub et al.

(10) Patent No.: US 6,404,573 B1
(45) Date of Patent: Jun. 11, 2002

(54) FULL AND HALF-RATE SIGNAL SPACE DETECTION FOR CHANNELS WITH A TIME-VARYING MTR

(75) Inventors: Bernardo Rub, Edina; Hamid R. Shafiee, Bloomington, both of MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/150,259

(22) Filed: Sep. 9, 1998

Related U.S. Application Data

(63) Continuation-in-part of application No. 09/076,961, filed on May 13, 1998, now Pat. No. 5,936,558.

(51) Int. Cl.$^7$ ................................................. G11B 5/09
(52) U.S. Cl. .............................. 360/46; 360/40; 360/48; 360/53; 341/59; 114/792
(58) Field of Search .............................. 360/40, 48, 45, 360/46; 341/58, 59; 714/701, 770, 769, 792, 795; 375/262, 265, 341

(56) References Cited

U.S. PATENT DOCUMENTS

| | | | | |
|---|---|---|---|---|
| 4,321,632 A | * | 3/1982 | Leis et al. ................. 360/49 |
| 4,567,591 A | * | 1/1986 | Gray et al. ................ 370/326 |
| 4,593,353 A | * | 6/1986 | Pickholtz ................... 705/55 |
| 4,949,196 A | * | 8/1990 | Davie et al. ............... 341/59 |
| 5,036,408 A | * | 7/1991 | Leis et al. ................. 360/48 |
| 5,243,605 A | * | 9/1993 | Lekmine et al. ........... 714/795 |
| 5,253,131 A | * | 10/1993 | Chevalier ................ 360/78.14 |
| 5,278,703 A | * | 1/1994 | Nguyen et al. ............ 360/46 |
| 5,353,352 A | * | 10/1994 | Dent e al. ................. 380/37 |
| 5,404,249 A | * | 4/1995 | Seki ........................ 380/48 |
| 5,434,807 A | * | 7/1995 | Yoshida ................... 708/253 |
| 5,438,462 A | * | 8/1995 | Copolillo ................. 360/53 |
| 5,485,472 A | * | 1/1996 | Fredrickson .............. 714/792 |
| 5,537,424 A | * | 7/1996 | Karabed et al. ........... 714/795 |
| 5,717,535 A | | 2/1998 | French et al. |
| 5,731,768 A | | 3/1998 | Tsang |
| 5,771,127 A | * | 6/1998 | Reed et al. ................ 360/51 |
| 5,784,417 A | * | 7/1998 | Alamouti ................. 714/341 |
| 5,936,558 A | * | 8/1999 | Shafiee et al. ............ 341/59 |
| 5,949,357 A | * | 9/1999 | Fitzpatrick et al. ........ 341/68 |

OTHER PUBLICATIONS

"Error Control Coding" Fundamentals and Applications, by Shu Lin, University of Hawaii, Texas A & M University and Daniel J. Costello, Jr., Illinois Institute of Technology, pp. 528–531 (1983).

J. Moon and B. Brickner, "Maximum Transition Run Codes for Data Storage Systems" IEEE Transactions on Magnetic, vol. 32, No. 5, pp. 3992–3994 (Sep. 1996).

(List continued on next page.)

*Primary Examiner*—Alan T. Faber
(74) *Attorney, Agent, or Firm*—Theodore M. Magee; Westman, Champlin & Kelly, P.A.

(57) ABSTRACT

A detector is provided to detect data values within a data signal that is sampled to provide temporally separated data samples. A first detector portion is configured to determine the location of a first sample vector in a first signal space. A second detector portion is configured to determine the location of a second sample vector in a second signal space. The second detector portion determines the location by using a logic statement to combine a plurality of location indicators. Each location indicator provides the location of the second sample vector relative to a respective boundary surface. The form of the logic statement is independent of the values of the location indicators. In addition, each location indicator is independent of all other location indicators.

24 Claims, 8 Drawing Sheets

FULL AND HALF-RATE SIGNAL SPACE DETECTION FOR CHANNELS WITH A TIME-VARYING MTR

The present application is also a continuation-in-part of U.S. patent application Ser. No. 09/076,961 entitled SIGNAL SPACE DETECTOR FOR CHANNELS UTILIZING A CODE HAVING TIME VARYING CONSTRAINTS filed May 13, 1998, now U.S. Pat. No. 5,936,558 for the same inventors of the present application, and claims priority from provisional application Ser. No. 60/075,711, filed Feb. 24, 1998.

FIELD OF THE INVENTION

The present invention relates to disc drives. More particularly, the present invention relates to a data detector in a disc drive wherein the data detector detects data encoded according to a code having time varying constraints.

BACKGROUND OF THE INVENTION

A typical disc drive includes one or more discs mounted for rotation on a hub or spindle. A typical disc drive also includes a transducer supported by a hydrodynamic air bearing which flies above each disc. The transducer and the hydrodynamic air bearing are collectively referred to as a data head. A drive controller is conventionally used for controlling the disc drive based on commands received from a host system. The drive controller controls the disc drive to retrieve information from the discs and to store information on the discs.

In one conventional disc drive, an electromechanical actuator operates within a negative feedback, closed-loop servo system. The actuator moves the data head radially over the disc surface for track seek operations and holds the transducer directly over a track on the disc surface for track following operations.

Information is typically stored in concentric tracks on the surface of the discs by providing a write signal to the data head to write information on the surface of the disc representing the data to be stored. In retrieving data from the disc, the drive controller controls the electromechanical actuator so that the data head flies above the disc and generates a read signal based on information stored on the disc. The read signal is typically conditioned and then decoded by the drive controller to recover the data.

A typical read channel includes the data head, preconditioning logic (such as preamplification circuitry and filtering circuitry), a data detector and recovery circuit, and error detection and correction circuitry. The read channel is typically implemented in a drive controller associated with the disc drive.

In disc drives, it is important that the error rate per number of bits recorded (the bit error rate) be maintained at a relatively low level. In order to improve bit error rate performance in disc drives, or in order to increase the linear recording density in disc drives, maximum likelihood sequence detection (MLSD) methods are desired. Such methods can be implemented using the well known Viterbi algorithm. However, a direct implementation of an MLSD method is very costly. For example, the channel response after forward filtering is typically quite long, and may contain ten or more terms. Thus, a Viterbi detector would require $2^{10-1}$ sates, which is impractically complex. Therefore, other techniques have been investigated which tend to reduce complexity yet still provide results which approach those of direct MLSD methods.

One such technique is to apply the Viterbi algorithm to a reduced number of terms by cancelling some of the terms with feedback. For example, by cancelling all but two terms (and including the main cursor) allows the Viterbi detector to have only four states. Such detectors are referred to as reduced state sequence estimators (RSSE).

Another technique is to choose a channel response target which is not a perfectly whitened target, but which has a fewer number of terms. in such systems, partial response (PR) targets have been developed. Among those targets is one referred to as enhanced extended partial response maximum likelihood ($E^2$PRML) target. At high recording densities, it has been observed that for certain high order partial response channels (such as the $E^2$PRML) channel, the dominant error events (the difference between two input sequences) encountered with detectors used with such partial response targets are generally of the form +/− (2,−2,2). Such errors are typically caused when a tribit is shifted by one sample time, or when a quadbit is mistaken as a dibit or vise versa.

The present invention addresses these and other problems, and offers other advantages over the prior art.

SUMMARY OF THE INVENTION

A relatively new class of codes are recently being investigated. Such codes include a maximum transition run (MTR) code which has been proposed as a way of removing dominant error events in Maximum Likelihood Sequence detectors (MLSD) at high densities or in higher-order partial response channels such as enhanced extended partial response maximum likelihood ($E^2$PRML). MTR codes act to increase the minimum Euclidean distance between data samples in a magnetic recording channel.

For example, an MTR=2 code limits the run of consecutive transitions in the write current to two. In essence, an MTR=2 code removes all patterns of encoded data containing more than two consecutive transitions. Consequently, the MTR=2 code also removes all patterns which cause a dominant error event for MLSD detectors at high recording densities and higher order PR channels.

Using MTR constraints, one detector has been developed which is referred to as the 3D-110 detector whose performance is comparable to a fixed delay tree search with decision feedback of depth 2 (FDTS/DF(2)) at high symbol densities. The detector is constructed by considering vectors of three received samples in a three dimensional space. Three planar boundaries are calculated and are used to divide the signal space into two regions, each of which correspond to a decision of +1 or −1 for the bit currently being processed. The 3D-110 detector also includes a forward filter which removes precursor intersymbol interference (ISI) terms and forces the two post cursor ISI terms to be 1 and 0, respectively, where the cursor is also normalized to 1. A feedback filter is implemented which removes all but the two post cursor ISI terms. Therefore, with no error propagation through the detector, the equivalent discrete-time channel pulse response can be denoted as 110. Such a constraint on the channel response is used to simplify the detector structure.

While the magnetic channel natural response is close to the 110 target at high recording densities, it deviates significantly from the 110 target at lower recording densities. Thus, constraining the pulse response to this particular 110 target results in performance degradation compared to the FDTS/DF(2), specifically at lower recording densities. Even at high densities, the implementation of practical elements in the detector can also cause deviation of the channel response from the 110 target. For example, the use of constrained length finite impulse response (FIR) filters can cause such deviation.

Thus, while the 3D-110 channel provides significant advantages in performance and/or simplicity over other detectors (such as the more complicated FTDS/DF(2) detector) it does contain the above-described disadvantages.

The present invention is directed to a system that addresses these and other problems, and offers other advantages.

A detector of the present invention is provided to detect data values within a data signal that is sampled to provide temporally separated data samples. A first detector portion is configured to determine the location of a first sample vector in a first signal space. A second detector portion is configured to determine the location of a second sample vector in a second signal space. The second detector portion determines the location by using a logic statement to combine a plurality of location indicators. Each location indicator provides the location of the second sample vector relative to a respective boundary surface.

The form of the logic statement is independent of the values of the location indicators. In addition, each location indicator is independent of all other location indicators.

BRIEF DESCRIPTION OF THE DRAWINGS

FIGS. 4-1 and 4-2 illustrate symbol constellations corresponding to a detector in accordance with one aspect of the present invention.

FIGS. 5-1 and 5-2 show waveforms illustrating dominant error events for MLSD of high densities.

FIGS. 7-1 and 7-2 illustrate a FTDS/DF tree used to illustrate operation of a detector in accordance with one aspect of the present invention.

DETAILED DESCRIPTION OF THE PREFERRED EMBODIMENTS

Figure 1:
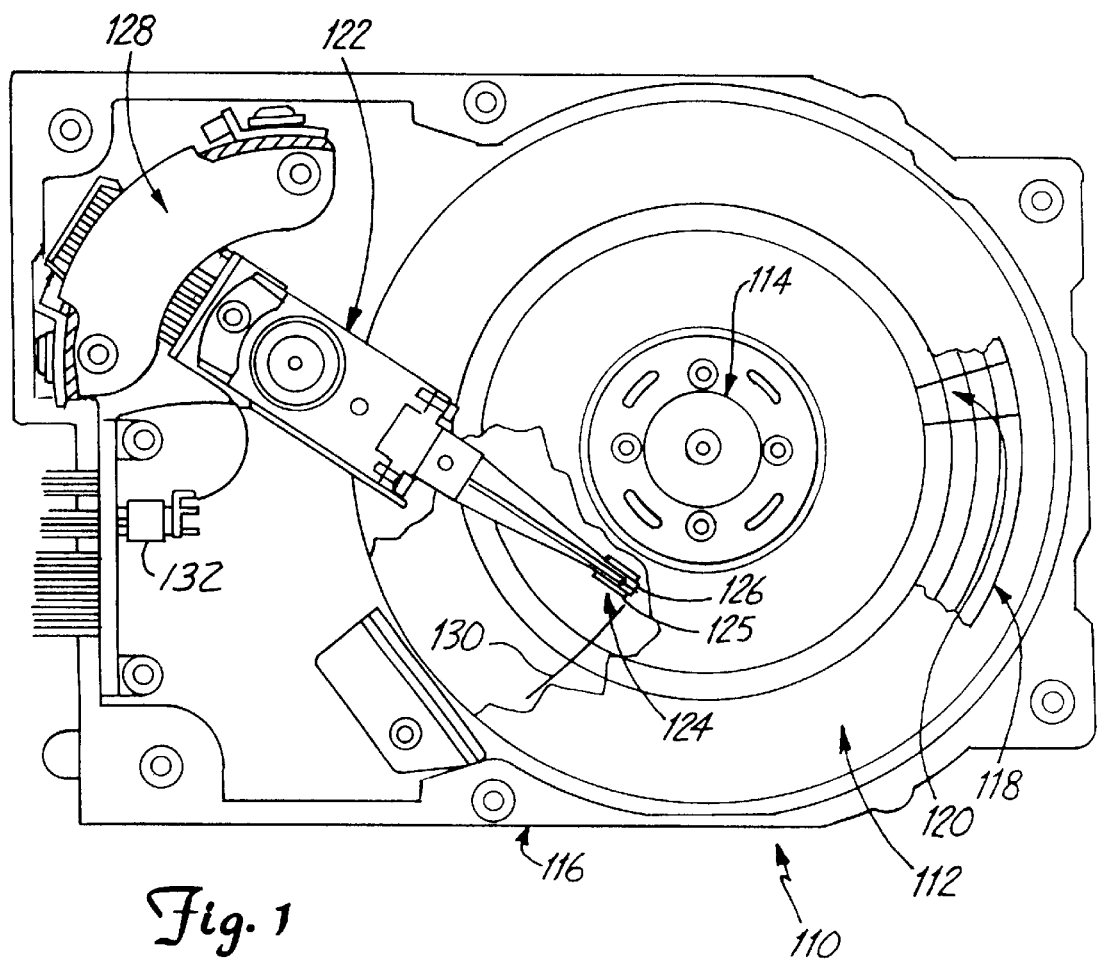
FIG. 1 is a top view of a disc drive with its upper casing removed and embodying features of the present invention.

Referring to FIG. 1, a rotary disc drive system suitable for incorporating the teachings of the present invention is shown in diagrammatic form and is referred to generally at 110. A plurality of information storage discs 112 are journaled about a spindle motor assembly 114 within a housing 116. Each disc 112 has a multiplicity of concentric circular recording tracks, indicated schematically at 118 for recording information. Each track 118 is subdivided into a plurality of sectors, indicated schematically at 120. Data can be stored on or retrieved from the discs 112 by referencing a specific track 118 and sector 120. An actuator arm assembly 122 is rotatably mounted preferably in one corner of the housing 116. The actuator arm assembly 122 carries a plurality of head gimbal assemblies 124 that each carry a slider 125 having a read/write head, or transducer 126, for reading information from and writing information onto the discs 112. A voice coil motor 128 is adapted to precisely rotate the actuator arm assembly 122 back and forth such that the transducers 126 move across the discs 112 along arc 130. Control circuitry 132 controls the position of the transducers 126 and processes information to be written to or received from discs 112.

Figure 2:
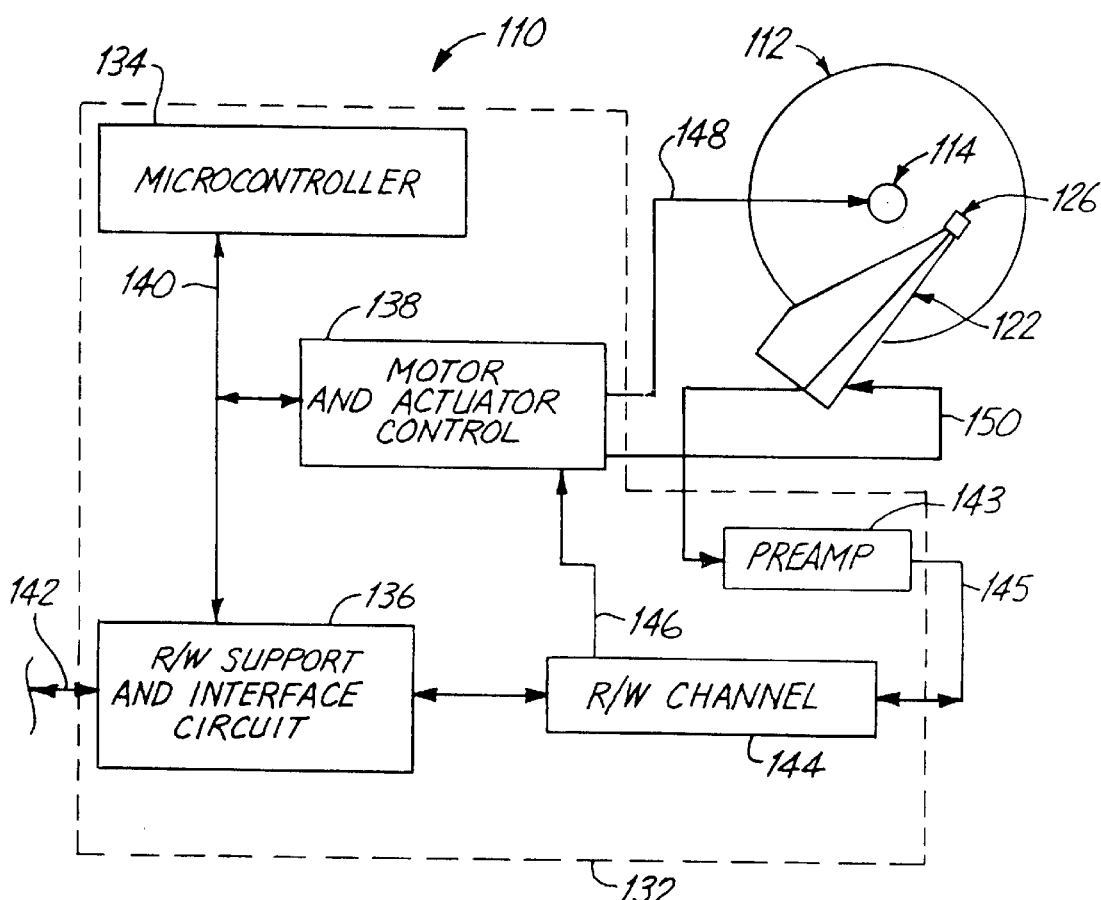
FIG. 2 is a high level block diagram of the disc drive shown in FIG. 1.

FIG. 2 shows a high level block diagram of the control circuitry 132 of disc drive system 110. A microcontroller 134 directly implements all of the primary functions of the disc drive system 110. A read/write support and interface control circuit, indicated generally at 136, and a motor and actuator controller 138 are connected to the microcontroller 134 by a general purpose data, address, and control bus 140. Circuit 136 in general provides a hardware interface between the disc drive system 110 and a host computer system (not shown) via a communications bus 142. Also, circuit 136 in general provides an interface between the motor and actuator controller 138 and a read/write channel 144. The read/write channel 144 receives a signal from preamplifier 143 which, in turn, receives a signal from transducers 126. Read/write channel 144 acts as an interface between the microcontroller 134 and the transducers 126 over lines 145. The read/write channel 144 also provides signals over line 146 to the motor and actuator controller 138. Controller 138 is provided as an interface between the microcontroller 134 and the motor assembly 114 over lines 148, and an interface between the microcontroller 134 and the actuator arm assembly 122 over lines 150.

Figure 3:
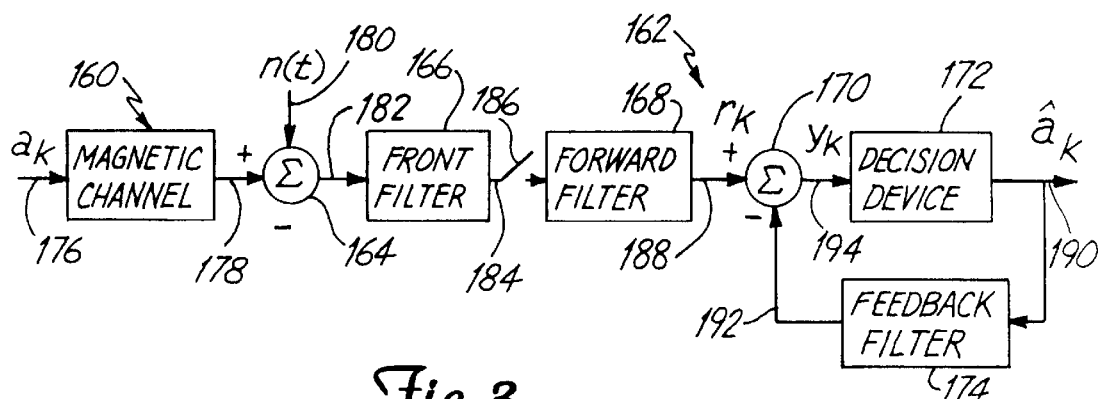
FIG. 3 is a schematic diagram illustrating a magnetic channel and associated reading circuitry to better illustrate notation used herein.

FIG. 3 is a schematic diagram of a magnetic channel 160 and read channel blocks 162 and is provided for purposes of better understanding the notation used herein. Channel 160, as is known, includes the recording medium, such as disc 112 and transducers 126. Read channel blocks 162 includes adder 164, front filter 166, sampler 186, forward filter 168, adder 170, detector 172 and feedback filter 174. Read channel blocks 162 are generally implemented in read/write channel 144 shown in FIG. 2. The input 176 to magnetic channel 166 is preferably a sequence of data bits, the data bit for a current time period k is represented by $a_k$. The sequence of input bits is preferably encoded, in accordance with one aspect of the present invention, according to a code which enforces an MTR=2 code constraint, and the bits are provided in a non-return-to-zero inverse (NRZI) format in which a one is represented by a transition and a zero is represented by a non-transition.

When the data bits are read from the magnetic channel, they are provided as a readback signal 178. The readback signal 178 is typically corrupted by noise 180 which is represented by n(t) being added to the readback signal 178 by adder 164. It should be noted that noise n(t) and adder 164 are shown as only representations of the no se which corrupts readback signal 178 and are thus not part of the actual hardware implementation. In any case, the noise n(t) is present and corrupts readback signal 178 to form corrupted read signal 182.

Corrupted read signal 182 is provided to front filter 166. Front filter 166 is, by way of example, implemented as an analog S low-pass filter which prevents aliasing and filters out high frequency noise and provides a filtered output 184 to sampler 186. Sampler 186 samples filtered output 184 and can be embodied as an analog-to-digital converter. The sampled signals produced by sampler 186 are provided to forward filter 168.

Forward filter 168 preferably operates alone or in combination with other filtering to whiten the noise in the readback signal and provide a modified readback signal 188 (also designated $r_k$) to adder 170. An example of forward filter 168 is a finite impulse response (FIR) filter which includes a plurality of taps. Forward filter 168 removes all precursor inter-symbol interference (ISI) terms. Post-cursor ISI terms are permitted to assume their natural values, because no constraints are enforced on the channel coefficients. Detector 172 provides a sequence 190 (also designated $â_k$) at its output.

The output $â_k$ is an estimate of the input data sequence $a_k$. The output $â_k$ is also provided to feedback filter 174 which is used to provide feedback signal 192 to adder 170. Feedback signal 192 is added to the output $r_k$ of forward filter 168. The combination of these signals is provided at the output 194 (also designated $y_k$) of adder 170 to decision device 172. In one embodiment of the present invention, feedback filter 174 is intended to remove all but two post-cursor ISI terms. In another embodiment, it is intended to remove all but three post-cursor ISI terms.

For feedback filters that remove all but two post-cursor terms, assuming all the previous decisions by the decision device 172 are correct, an equivalent discrete-time channel response includes three terms and is denoted as $(1, f_1, f_2)$.

Thus, at time k, the noiseless input $y_k$, to decision device 172 can be written as follows:

$$y_k = a_k + f_1 a_{k-1} + f_2 a_{k-2} \qquad \text{Equation 1}$$

where $a_k$ is the input data bit at time k.

A three-dimensional signal space detector (3D-SSD) can be implemented by first considering a symbol constellation in three-dimensional space. As described in greater detail below, such a detector maps all possible symbols which could represent the input data sequence to the three-dimensional space. The detector then obtains a sample vector that includes contributions from a plurality of input samples that are each formed from a plurality of terms indicative of input data samples in the input sample sequence. The sample vector is then mapped to the same three-dimensional space in the constellation. The detector then determines which of the possible data symbols is closest in the three-dimensional space to the sample vector at each time interval. This is analogous to determining a path corresponding a minimum Euclidean distance between an observed and the desired sample values for a fixed-delay detector, such as an FDTS/DF detector, or for a look-ahead partial response channel such as that described by Patel, Rutledge and So in "Performance Data For A Six-Sample Look-Ahead 1, 7 ML Detection Channel", *IEEE Trans. Magn.* Vol. 29, No. 6, pp. 4012–4014, November, 1993 and that described by Yamasaki et al., "A 1, 7 Code EEPR4 Read Channel IC With Analog Noise Whitened Detector", *PROC. of ISSCC*, 1997, pp. 316–317.

Each pair of possible symbols which point to different detector decisions should be separated by a boundary plane. The planar boundaries are combined by logic rules so that the signal space is partitioned into two regions, one corresponding to a detector decision of +1 and the other corresponding to a detector decision of −1. Depending on where the sample vector falls in the three-dimensional vector space relative to the boundary planes, a binary decision is released by detector 172 as the detector output $â_k$. As will also be described below, the detector structure is simplified by eliminating planes which are redundant, and also by eliminating separate symbols which are much further apart than the minimum Euclidean distance associated with the code.

Figures 1, 4:
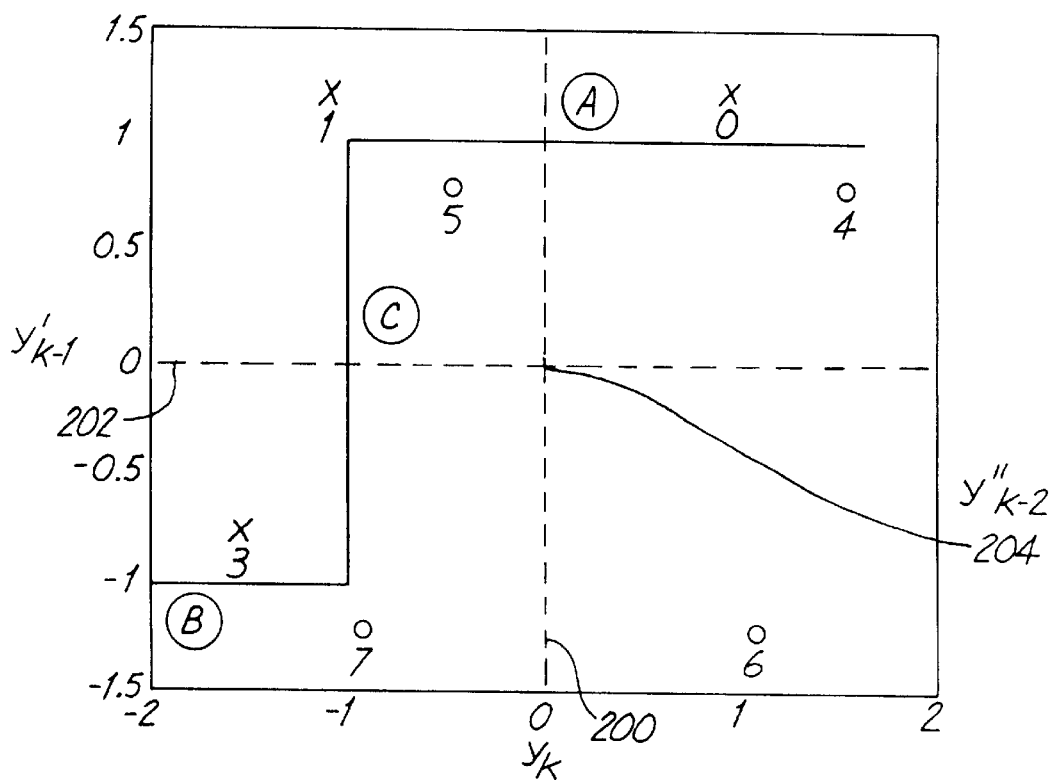
Figures 2, 4:
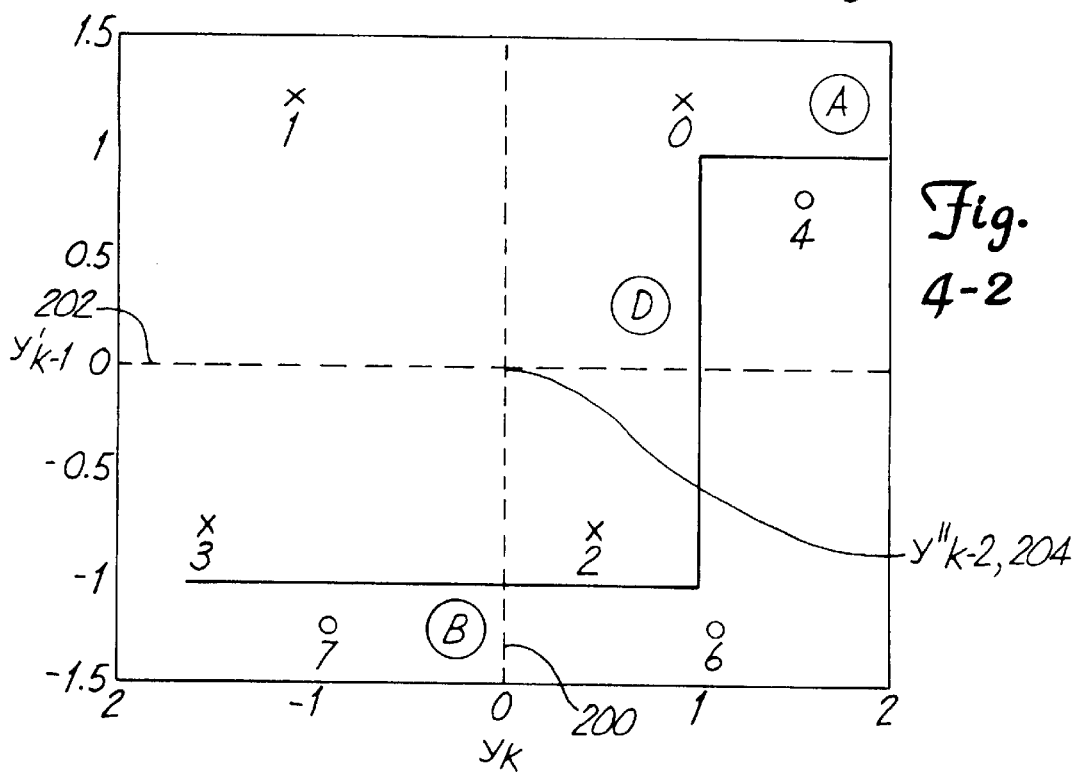

FIGS. 4-1 and 4-2 illustrate a vector space for a detector which analyzes an input sequence having three terms which constitute a sample vector, also known as an observation vector. More specifically, FIGS. 4-1 and 4-2 illustrate symbol constellations of a Lorentzian channel at symbol density of 2.25. The constellations have axes $y_k$ (also designated by numeral 200) and $y'_{k-1}$ (also designated by numeral 202). The constellations shown in FIGS. 4-1 and 4-2 also include a third axis $y''_{k-2}$ (which is also designated by the number 204). Axis $y''_{k-2}$ extends into and out of the plane of the paper containing FIGS. 4-1 and 4-2.

As will be described, some symbols are removed based on the MTR constraint, and all of the possible remaining symbols which could represent the three-dimensional observation vector are mapped to the constellations illustrated in FIGS. 4-1 and 4-2. Planar boundaries are then constructed to divide those symbols in the three-dimensional space defined by the constellations. The observation vector is then mapped to the constellation and the detector provides a decision based upon where the observation vector resides in the constellation relative to the planar boundaries.

The axes of the constellations are defined as follows:

$$y_k = a_k + f_1 a_{k-1} + f_2 a_{k-2} \qquad \text{Equation 2}$$

$$y'_{k-1} = a_{k-1} + f_1 a_{k-2} \qquad \text{Equation 3}$$

$$y''_{k-2} = a_{k-2} \qquad \text{Equation 4}$$

where $y'_{k-1}$ and $y'_{k-2}$ generically denote the is detector inputs at times k−1 and k−2 with the intersymbol interference due to the available past decisions (i.e., the decisions for $â_{k-3}$ and $â_{k-4}$ at time k) cancelled. The detector must make a decision on the input bit $a_{k-2}$ (i.e., the input bit which was received two time intervals previously) at each time k in the detection process because the detector is processing three input samples as an observation vector.

TABLE 1

| Index | $(a_{k-1}, a_{k-2}, a_k)$ | $(y_k, y'_{k-1}, y''_{k-2})$ |
| --- | --- | --- |
| 0 | (+1, +1, +1) | (+1 + $f_1$ + $f_2$, +1 + $f_1$, +1) |
| 1 | (+1, +1, −1) | (−1 + $f_1$ + $f_2$, +1 + $f_1$, +1) |
| 2* | (+1, −1, +1) | (+1 − $f_1$ + $f_2$, −1 + $f_1$, +1) |
| 3 | (+1, −1, −1) | (−1 − $f_1$ + $f_2$, −1 + $f_1$, +1) |
| 4 | (−1, +1, +1) | (+1 + $f_1$ − $f_2$, +1 − $f_1$, −1) |
| 5* | (−1, +1, −1) | (−1 + $f_1$ − $f_2$, +1 − $f_1$, −1) |
| 6 | (−1, −1, +1) | (+1 − $f_1$ − $f_2$, −1 − $f_1$, −1) |
| 7 | (−1, −1, −1) | (−1 − $f_1$ − $f_2$, −1 − $f_1$, −1) |

Table 1 illustrates all possible input sequences which could be represented by the observation vector. Table 1 includes an index which refers to an index numeral 0–7 corresponding to the $2^n$ (where n=3) possible symbols. Table 1 also includes the possible symbols written out in terms of $a_{k-2}$, $a_{k-1}$ and $a_k$, and also provides an evaluation of the axis $y_k$, $y'_{k-1}$ and $y''_{k-2}$ written in terms of the channel response.

Figures 1, 2, 5:
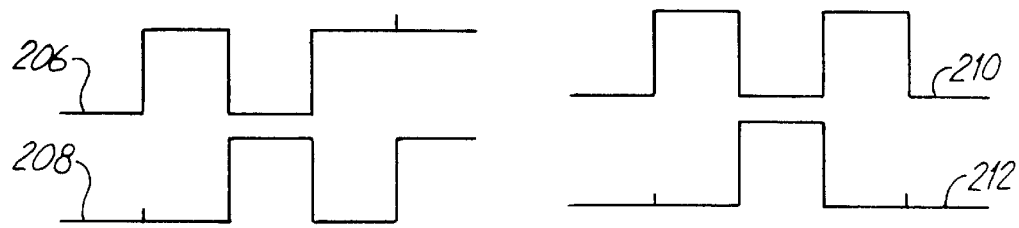

FIGS. 5-1 and 5-2 illustrate waveforms 206, 208, 210 and 212 which represent dominant error events observed for MLSD detectors at high densities and high order partial response targets. In FIG. 5-1, the error event is generated when a tribit waveform 206 is shifted one time interval to produce a shifted tribit 208. In FIG. 5-2, the error event is generated when a quadbit waveform 210 is detected as a dibit waveform 212 or vice versa.

In order to eliminate such dominant error events, the input data is preferably encoded according to an MTR=2 constraint which disallows tribits. Thus, in Table 1, either symbol 2 or symbol 5 must be disallowed, depending upon the value of $\hat{a}_{k-3}$, since those symbols represent the presence of a tribit. For example, with $\hat{a}_{k-3}=+1$, symbol 5 corresponds to a sequence of input bits of the form $(+1, -1, +1, -1)$ which contains three consecutive transitions and must be eliminated. By the same token, where $\hat{a}_{k-3}=-1$, symbol 2 must be eliminated.

The constellation shown in FIG. 4-1 has all possible symbols mapped thereto, assuming $\hat{a}_{k-3}=-1$. Note that symbol 2 is not mapped to the constellation shown in FIG. 4-1. Similarly, the constellation shown in FIG. 4-2 has all of the possible symbols mapped thereto where $\hat{a}_{k-3}=+1$. Note that symbol 5 has been eliminated.

The symbols corresponding to $y''_{k-2}=+1$ and $-1$ are denoted by x's and 0's, respectively. The index number is denoted below the symbol marker x's and 0's.

FIGS. 4-1 and 4-2 also illustrate slicer planes A, B, C and D which are used to divide the various symbols mapped to the constellations. Initially, it is noted that four slicer planes are used. However, as will be described, in order to simplify the detector structure, the number of planes is limited to three (e.g., planes C and D are combined to form a new plane E discussed below). In order to further simplify the detector structure, the directions of the planes are also constrained.

Plane A is provided to separate symbols 0 and 4 (and also symbols 1 and 5 in FIG. 4-1). For an optimal detector, the decision boundaries are planes which bisect a line which connects the pairs of symbols being separated. However, for simplicity, the system is constrained to locate the plane not to separate the two symbols in three-dimensional space, but to separate their projections on a surface. This constraint is implemented by picking the two coordinates which contribute most heavily to the distance between the two symbols. It can be seen that the $y''_{k-2}$ coordinate should be retained since the two symbols which correspond to different decisions on the input bit $a_{k-2}$ are easily separated on this axis. Of the remaining two coordinates (and except for very low symbol densities), the $y'_{k-1}$ coordinate contributes more heavily to the distance between symbols 0 and 4 than the $y_k$ coordinate. Thus, the symbols are projected to the $y'_{k-1} y''_{k-2}$ surface. Slicer plane A is thus constrained to only rotate perpendicular to the $y'_{k-1} y''_{k-2}$ surface.

The projection of plane A onto the chosen surface is thus represented as a line whose direction changes as the slicer plane is allowed to rotate. All points on the line have the same distance from the projected pair of symbols.

From Table 1, it can be seen that the coordinates of the projections of symbols 0 and 4 on the $y'_{k-1} y''_{k-2}$ surface are given by $(1+f_1, +1)$ and $(1-f_1, -1)$, respectively. Thus, the equation of plane A can be obtained as follows:

$$(y'_{k-1}-(-1+f_1))^2+(y''_{k-2}-1)^2=(y'_{k-1}-(1-f_1))^2+(y''_{k-2}+1)^2 \quad \text{Equation 5}$$

This expression can be simplified to yield:

$$y''_{k-2}+f_1 y'_{k-1}-f_1=0 \quad \text{Equation 6}$$

Using a similar procedure, the equation for slicer plane B which separates symbols 3 and 7 (and also symbols 2 and 6 in FIG. 4-2) can be written as follows:

$$y''_{k-2}+f_1 y'_{k-1}+f_1=0 \quad \text{Equation 7}$$

When $\hat{a}_{k-3}=-1$, plane C separates symbols 3 and 5. Plane C is constrained to only rotate perpendicular to the $y_k y''_{k-2}$ surface since the coordinates which contribute most heavily to the distance between the symbols are the coordinates corresponding to the $y_k$ and $y''_{k-2}$ axes. The plane equation is derived by finding a line which bisects the projections of the two symbols onto the $y_k y''_{k-2}$ surface.

The operation is again repeated for plane D which separates symbols 2 and 4 when $\hat{a}_{k-3}=+1$.

These procedures result in the following four location identifier equations:

$$A: \text{sgn } (y''_{k-2}+f_1 y'_{k-1}-f_1) \quad \text{Equation 8}$$

$$B: \text{sgn } (y''_{k-2}+f_1 y'_{k-1}+f_1) \quad \text{Equation 9}$$

$$C: \text{sgn } (y''_{k-2}-(f_1-f_2)y_k-(f_1-f_2)), \quad \text{Equation 10}$$

where $\hat{a}_{k-3}=-1$ $$D: \text{sgn } (y''_{k-2}-(f_1-f_2)y_k+(f_1-f_2)) \quad \text{Equation 11}$$

where $\hat{a}_{k-3}=+1$.

Location identifier equations C and D can also be combined to provide:

$$E: \text{sgn } (y_{k-2}(f_1-f_2)y_k+(f_1 f_2)\hat{a}_{k-3}) \quad \text{Equation 12}$$

Equation 12 can be further simplified by setting $(f_1-f_2)=1$. This simplification has a negligible effect on the detector performance since at lower channel densities of interest, the two symbols to be separated by this plane are further apart than those separated by planes A and B. Therefore, a slight change in the plane orientation and position does not impact a relative location of the received samples with respect to this plane. Thus, Equation 12 can be simplified as follows:

$$E: \text{sgn } (y''_{k-2}-y_k+\hat{a}_{k-3}) \quad \text{Equation 13}$$

By substituting for $y'_{k-1}$ and $y''_{k-2}$ from Equations 3 and 4, the following relations are obtained for the three location identifiers:

$$A: \text{sgn } (y_{k-2}+f_1 y_{k-1}+\Delta A) \quad \text{Equation 14}$$

$$B: \text{sgn } (y_{k-2}+f_1 y_{k-1}+\Delta B) \quad \text{Equation 15}$$

$$E: \text{sgn } (y_{k-2}-y_k+\Delta E) \quad \text{Equation 16}$$

where values $\Delta A$, $\Delta B$ and $\Delta E$ are offset values given by:

$$\Delta A=(-f_1-f_1 f_2) \hat{a}_{k-3}-f_2 \hat{a}_{k-4} f_1 \quad \text{Equation 17}$$

$$\Delta B=(-f_1 f f_2) \hat{a}_{k-3} f_2 \hat{a}_{k-4} f_1 \quad \text{Equation 18}$$

$$\Delta E=(-f_1+1) \hat{a}_{k-3} f_2 \hat{a}_{k-4} \quad \text{Equation 19}$$

The offset values, in general, are implemented as short FIR filters with binary inputs, two input multiplexers, or look up tables.

Decision logic can be implemented by moving a test point through the three-dimensional signal space and recording the relative position of the point with respect to the planes. The corresponding detector output is obtained by finding the closest symbol in the constellation to the test point. A logic rule or statement is then obtained by combining the cases which result in the same output decision from the detector. However, for the three-dimensional case discussed herein, the logic rule can simply be obtained by inspection. Mapping the boundary decisions $-1$ to 0, the logic rule can be written as follows:

$$\hat{a}_{k-2}=B \cdot E+A \quad \text{Equation 20}$$

where "·" denotes a logical AND operation and + denotes a logical OR operation.

Figure 6:
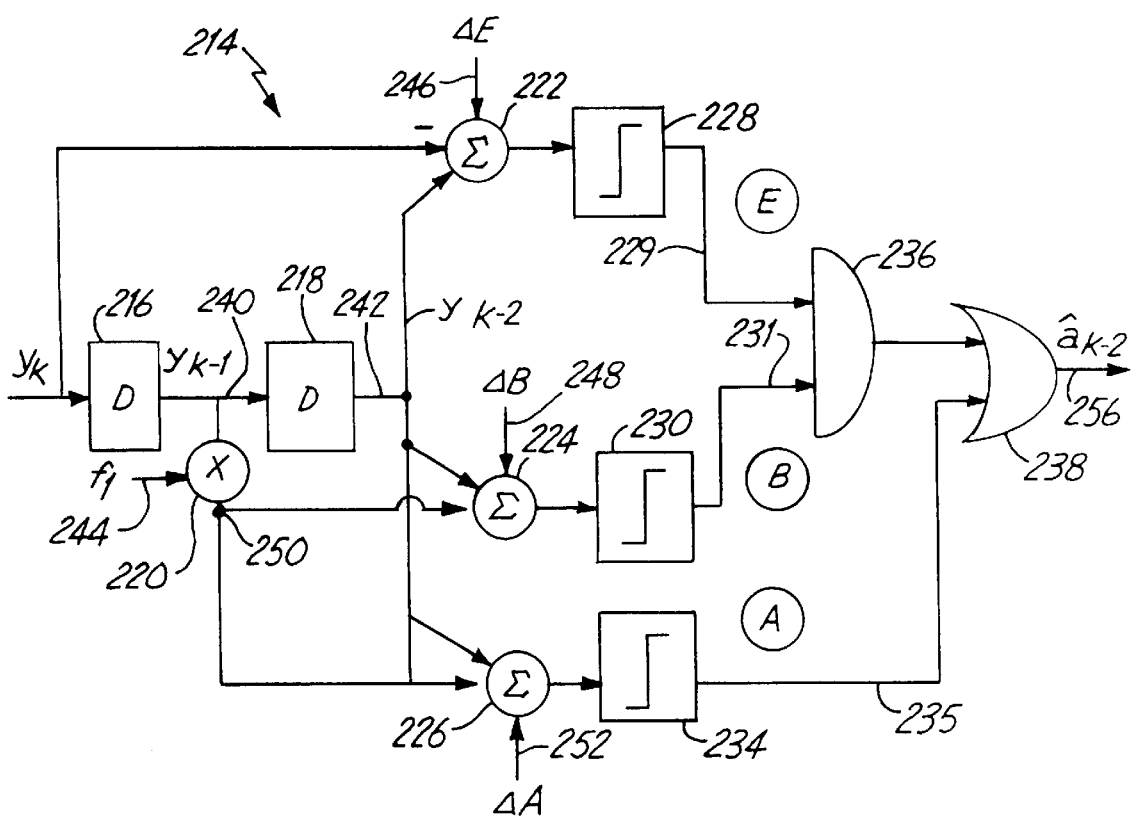
FIG. 6 is a block diagram illustrating a detector architecture of a detector in accordance with one aspect of the present invention.

FIG. 6 is an architectural block diagram illustrating a 3D-SSD detector 214 in accordance with one aspect of the present invention. Detector 214 includes delay operators 216 and 218, multiplier 220, summing circuits 222, 224, and 226, slicers 228, 230, 234, AND circuit 236 and OR circuit 238. As illustrated in FIG. 6, $y_k$ is provided to delay operator 216 which provides, at its output 240, $y_{k-1}$. That term is also provided to delay operator 218 which provides at its output 242, $y_{k-2}$. Multiplier 220 receives at its input 244, f1. Summing circuit 222 receives at one input 246 thereof the offset value ΔE and at the other two inputs thereof $y_k$ and $y_{k-2}$. Summing circuit 224 receives at one input 248 thereof offset value ΔB and at the other two inputs thereof the output 250 of multiplier 220 and also $y_{k-2}$. Summing circuit 226 receives, at a first input 252 thereof the offset value ΔA and at its other inputs the output 250 from multiplier 220 and $y_{k-2}$ from delay operator 218. The output of summing circuits 222, 224 and 226 are provided to slicers 228, 230 and 234, respectively. The outputs 229, 231 and 235 of slicers 228, 230 and 234 are to circuits 236 and 238 as shown. The output 256 of circuit 238 provides $â_{k-2}$. Thus, detector 214 uses one multiplier, three slicers, three adders and three two-input multiplexers. A similar 3D-110 detector can be implemented using three slicers, three adders and two-input multiplexers.

In the above discussion, detector 214 was constructed by taking advantage of the fact that, at each time interval, only one of the two symbols 2 or 5 from Table 1 is present in the signal space constellation. This is because the MTR=2 code removes one of the two symbols at all times.

However, the dominant error events mentioned with respect to FIGS. 5-1 and 5-2 can also be removed using a time-variant transition run constraint. Such a constraint allows tribits, but only allows them to start at predetermined intervals. In one embodiment, the time-variant transition run constraint allows tribits to start only at every other (i.e., even or odd) numbered time intervals. This type of relaxed constraint allows the development of codes with higher rates. Thus, with the time variant MTR code, it is possible to have both symbols 2 and 5 present in the signal constellation at every other time interval. In order to implement the 3D detectors in accordance with the present invention, modifications must be made in order to accommodate the change in the code constraint.

Figures 1, 7:
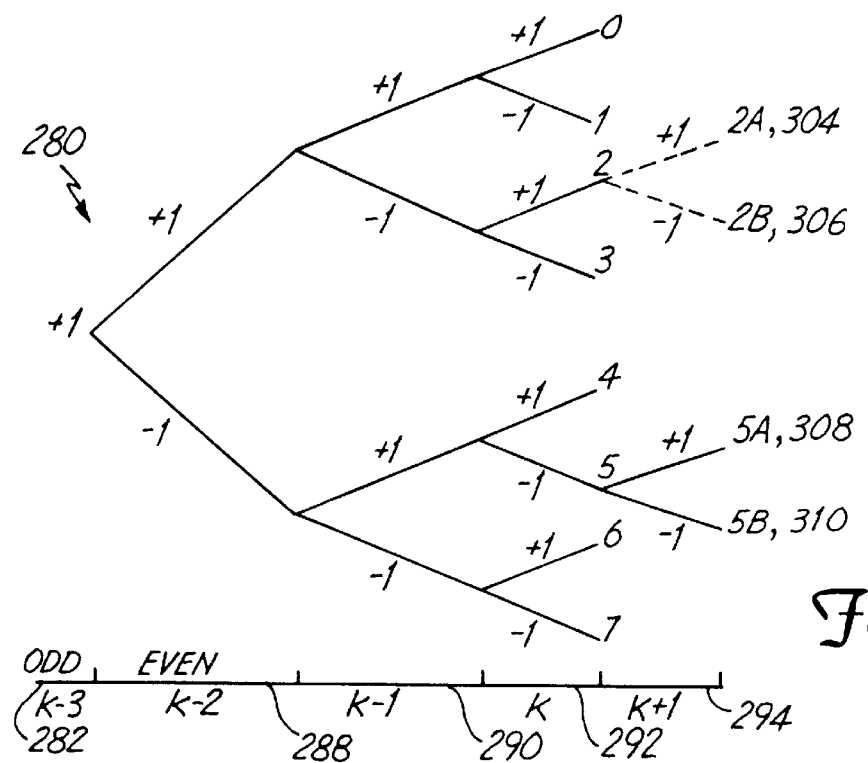
Figures 2, 7:
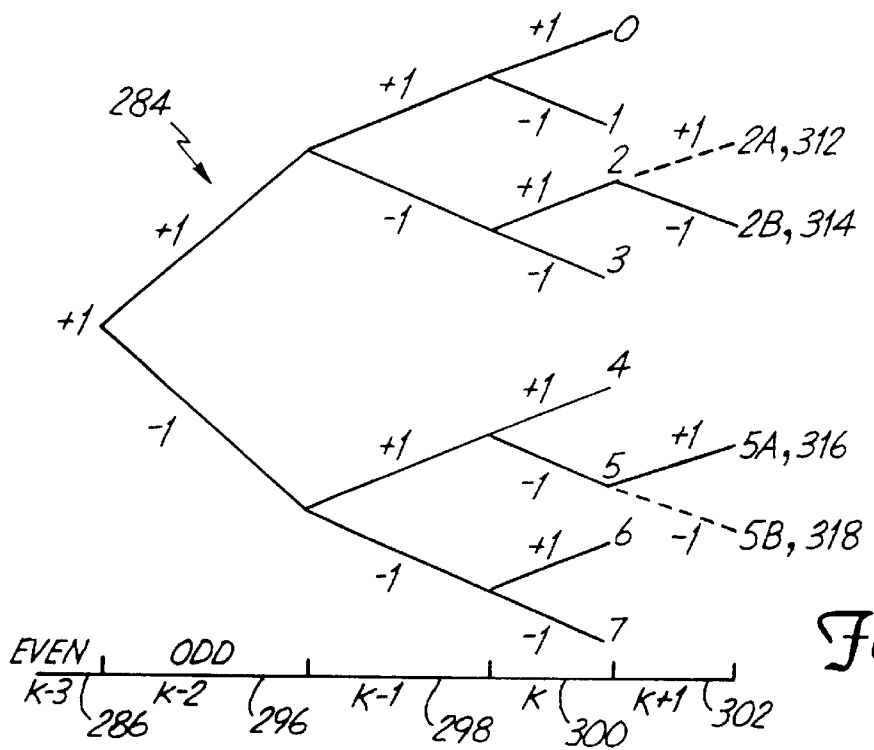

In order to better understand the modifications required to detect data encoded according to a code having the time-variant code constraint, a signal space detector in accordance with the present invention can be understood with reference to an FDTS/DF tree of depth 2. FIG. 7-1 illustrates such a tree 280 where the tree has a root beginning at an odd time interval k−3 (also designated by numeral 282). FIG. 7-2 illustrates such a tree 284 having a root which begins at an even time interval k−3 (also designated 286). Trees 280 and 284 both assume that $â_{k-3}$=+1.

Without any loss of generality, the present discussion proceeds under the assumption that tribits are only allowed to start at even time intervals. While the root of trees 280 and 284 illustrate the value of $a_{k-3}$, the subsequent branches which proceed from left to right along the tree illustrate the value of samples $a_{k-2}$, $a_{k-1}$, $a_k$ and $a_{k+1}$. The corresponding time intervals are illustrated along the bottom of each tree and are designated, in FIG. 7-1, by numerals 288, 290, 292 and 294 and in FIG. 7-2 by numerals 296, 298, 300 and 302.

By examining trees 280 and 284, it can be seen that either path 2 or path 5 will be disallowed since one of them violates the code constraint. For example, in FIG. 7-1, path 5 can be pruned from the tree since it reveals a tribit pattern (+1, −1, +1, −1) which starts at an odd time interval. Therefore, where the root corresponds to an odd time interval, that situation is identical to the MTR=2 in the previously described detector. On the other hand, as shown in FIG. 7-2, where the root corresponds to an even time interval (and where tribits are allowed to start at even time intervals) both branches 2 and 5 are permitted.

In order to realize the coding gain for an FDTS/DF(2) detector with a time-variant MTR code, the problematic path can be removed at odd times and restored at even times. However, the presence of both paths 2 and 5 increases the chance of an erroneous section of trees 280 or 284 to be selected. In fact, as user densities increase, these errors begin to become so large that they eliminate the code-rate benefit of the time-variant MTR code.

Therefore, in accordance with one aspect of the present invention, branches 2 and 5 are extended one step further in time (beyond time interval k). Such extensions are labeled 2A, 2B, 5A and 5B in FIGS. 7-1 and 7-2 and are also indicated by designation numerals 304, 306, 308, 310, 312, 314, 316 and 318. Extension of paths 2 and 5 does not affect pruning of the branches as illustrated in FIG. 7-1. Path 2 is still allowed and path 5 is still disallowed. However, in FIG. 7-2, extension of the paths one extra time interval allows the pruning of branch 2B. In other words, branch 2A is still allowed in FIG. 7-2 because it does not violate the time-variant MTR code constraint. However, branch 2B does violate the code constraint because it represents a tribit beginning at an odd time interval. Similarly, branch 5B in FIG. 7-2 is allowed, while branch 5A can be eliminated.

The remaining symbols, after pruning, in FIG. 7-2 which are represented by path 2A and path 5B correspond to an error event of the form +/− (2, −2, 2, 2). Thus, the distance between these two symbols should be considerably greater than the minimum Euclidean distance for the code.

In one aspect of the present invention, a three-dimensional/four-dimensional signal space detector (3D/4D SSD) is implemented that accepts samples having three post-cursor ISI terms. The detector provides three-dimensional detection and four-dimensional detection. In three-dimensional detection, the detector selects a data value by determining the location of a sample vector in a three-coordinate signal space. In four-dimensional detection, the detector uses the location of a sample vector in a four-coordinate signal space to determine a data value.

The 3D/4D SSD works well with data that has been encoded using a time-varying MTR code. When used with an MTR code that has an MTR constraint of 2 for odd time intervals and an MTR constraint of 3 for even time intervals, the three-dimensional detection system is used at odd time intervals and the four-dimensional detection system is used at even time intervals.

The sample vectors used in the 3D/4D SSD are preferably constructed from combinations of samples that are defined by the following generic sample equations:

$$y_k = a_k + f_1 a_{k-1} + f_2 a_{k-2} + f_3 a_{k-3} \qquad \text{Equation 30}$$

$$y_{k-1} = a_{k-1} + f_1 a_{k-2} + f_2 a_{k-3} + f_3 â_{k-4} \qquad \text{Equation 31}$$

$$y_{k-2} = a_{k-2} + f_1 a_{k-3} + f_2 â_{k-4} + f_3 â_{k-5} \qquad \text{Equation 32}$$

$$y_{k-3} = a_{k-3} + f_1 â_{k-4} + f_2 â_{k-5} + f_3 â_{k-6} \qquad \text{Equation 33}$$

Where $y_k$ is the current sample provided to the detector, $â_{k-x}$ is the (k−x)th detected data value, and $a_{k-x}$ is the (k−x)th input value with the current input value that is being detected being the $a_{k-3}$ input value.

Thus, in the three-dimensional portions of the 3D/4D SSD, the sample vector is based on the combination of $y_{k-1}$, $y_{k-2}$, and $y_{k-3}$ and in the four-dimensional portions the sample vector is based on the combination of $y_k$, $y_{k-1}$ and $y_{k-3}$.

During purely three-dimensional detection, the location of the three-dimensional sample vector is determined in a three-dimensional space defined by the following three axis:

$$y_{k-1}=a_{k-1}+f_1 a_{k-2}+f_2 a_{k-3} \qquad \text{Equation 34}$$

$$y''_{k-2}=a_{k-2}+f_1 a_{k-3} \qquad \text{Equation 35}$$

$$y'''_{k-3}=a_{k-3} \qquad \text{Equation 36}$$

Note that each of the three axes are formed by cancelling the contribution of at least one input value that contributes to a respective generic sample. This can be seen by defining the axes in terms of the samples using generic sample equations 30–33 above. The definitions of the axes then become as follows:

$$y'_{k-1}=y_{k-1}-f_3 \hat{a}_{k-4} \qquad \text{Equation 37}$$

$$y''_{k-2}=y_{k-2}-f_2 \hat{a}_{k-4}-f_3 \hat{a}_{k-5} \qquad \text{Equation 38}$$

$$y'''_{k-3}=y_{k-3}-f_1 \hat{a}_{k-4}-f_2 \hat{a}_{k-5}-f_3 \hat{a}_{k-6} \qquad \text{Equation 39}$$

As in other embodiments of the invention, the 3D/4D SSD determines an odd time interval data value using boundary planes in the three dimensional signal space. The boundary planes are determined in a manner similar to that described above in connection with equations 5–19 yielding the following four location identifiers:

$$A: \mathrm{sgn}\,(y_{k-3}+f_1 y_{k-2}+\Delta A) \qquad \text{Equation 40}$$

$$B: \mathrm{sgn}\,(y_{k-3}+f_1 y_{k-2}+\Delta B) \qquad \text{Equation 41}$$

$$C: \mathrm{sgn}\,(y_{k-3}-y_{k-1}+\Delta C) \qquad \text{Equation 42}$$

$$D: \mathrm{sgn}\,(y_{k-3}-y_{k-2}+\Delta D) \qquad \text{Equation 43}$$

where sgn (expression) provides the sign of the expression and values $\Delta A$, $\Delta B$, $\Delta C$, and $\Delta D$ are offset values given by:

$$\Delta A=(-f_1-f_1 f_2)\hat{a}_{k-4}-(f_2+f_1 f_3)\hat{a}_{k-5}-f_3 \hat{a}_{k-6}-f_1 \qquad \text{Equation 44}$$

$$\Delta B=(-f_1-f_1 f_2)\hat{a}_{k-4}-(f_2+f_1 f_3)\hat{a}_{k-5}-f_3 \hat{a}_{k-6}+f_1 \qquad \text{Equation 45}$$

$$\Delta C=-(f_1-f_3)\hat{a}_{k-4}-f_2 \hat{a}_{k-5} f_3 \hat{a}_{k-6}-1 \qquad \text{Equation 46}$$

$$\Delta D=-(f_1-f_3)\hat{a}_{k-4}-f_2 \hat{a}_{k-5}-f_3 \hat{a}_{k-6}+1 \qquad \text{Equation 47}$$

Where planes C and D are utilized when $\hat{a}_{k-4}$ is $-1$ and $+1$, respectively. Mapping $-1$ to 0 in Equations 40–43, the detector output provides a detector value $\hat{a}_{k-3}$, according to the following:

$$\hat{a}_{k-3}=A+B \cdot C \text{ when } \hat{a}_{k-4}=-1 \qquad \text{Equation 48}$$

$$\hat{a}_{k-3}=A+B \cdot D \text{ when } \hat{a}_{k-4}=+1 \qquad \text{Equation 49}$$

where "·" represents a logical AND operation and "+" represents a logical OR operation.

When attempting to detect a data value at an even time interval, the 3D/4D SSD determines the location of a four-dimensional sample vector in a four-coordinate signal space. As noted above, the four-dimensional sample vector used during four-dimensional detection is based on the combination of $y_k$, $y_{k-1}$, $y_{k-2}$, and $y_{k-3}$, which are described by equations 30–33 above. During four-dimensional detection, the location of this four-dimensional sample vector is determined in a four-coordinate space defined by the following four axes:

$$y_k=a_k+f_1 a_{k-1}+f_2 a_{k-2}+f_3 a_{k-3} \qquad \text{Equation 50}$$

$$y'_{k-1}=a_{k-1}+f_1 a_{k-2}+f_2 a_{k-3} \qquad \text{Equation 51}$$

$$y''_{k-2}=a_{k-2}+f_1 a_{k-3} \qquad \text{Equation 52}$$

$$y'''_{k-3}=a_{k-3} \qquad \text{Equation 53}$$

In this four-coordinate signal space, the location of the four-dimensional sample vector is compared to the location of a boundary plane that separates two symbols corresponding to paths 2A and 5B of FIG. 7-2.

In the four-coordinate signal space $(y'''_{k-3}, y''_{k-2}, y'_{k-1}, y_k)$ of the 3D/4D SSD, samples 2A and 5B are located at $(1, -1+f_1, 1-f_1+f_2, 1+f_1-f_2+f_3)$ and $(-1, 1-f_1, -1+f_1-f_2, -1-f_1+f_2-f_3)$, respectively. Of the four coordinates, coordinates $y'''_{k-3}$ and $y_k$ contribute the most to the distance between samples 2A and 5B. Using the projection techniques described above, the plane P between 2A and 5B is described by the following:

$$(y'''_{k-3}-1)^2+(y_k-(1+f_1-f_2+f_3))^2=(y'''_{k-3}+1)^2+(y_k-(-1-f_1+f_2-f_3))^2 \qquad \text{Equation 54}$$

This equation simplifies to:

$$y'''_{k-3}+(1+f_1-f_2+f_3)y_k=0 \qquad \text{Equation 55}$$

Substituting for $y'''_{k-3}$ using equation 39 above, equation 55 becomes:

$$y_{k-3}+(1+f_1-f_2+f_3)y_k-f_1 \hat{a}_{k-4}-f_2 \hat{a}_{k-5}-f_3 \hat{a}_{k-6}=0 \qquad \text{Equation 56}$$

Using the notation developed above, location identifier P is then defined as:

$$P: \mathrm{sgn}\,(y_{k-3}+(1+f_1-f_2+f_3)y_k+\Delta P) \qquad \text{Equation 57}$$

where $\Delta P$ is defined by:

$$\Delta P=-f_1 \hat{a}_{k-4}-f_2 \hat{a}_{k-5}-f_3 \hat{a}_{k-6} \qquad \text{Equation 58}$$

Since the two symbols 2A and 5B correspond to error events of the form $+/-$ (2, $-2$, 2, 2), the distance between the two symbols should be considerably greater than the minimum Euclidean distance for the code. Therefore, equation 57 can be further simplified without a significant impact on the detector performance, resulting in:

$$P: \mathrm{sgn}(y_{k-3}+y_k+\Delta P) \qquad \text{Equation 59}$$

In the four-dimensional detection, location identifiers A, B, C, and D of equations 40–43 that were used in the three-dimensional detection continue to be valid. Using these location identifiers and location identifier P of equation 59, the four-dimensional logic detection equation at even time periods becomes:

$$\hat{a}_{k-3}=A+B \cdot C+B \cdot D \cdot P \qquad \text{Equation 60}$$

Where "·" represents a logical AND operation, "+" represents a logical OR operation, and A, B, C, D, and P include the mapping of 0 for $-1$ where necessary.

Note that none of the location identifiers depend on another location identifier. In other words, each can be determined without reference to another location identifier. Also note that the format of the four-dimensional logic statement of Equation 60 does not depend on the value of a location identifier.

Figure 8:
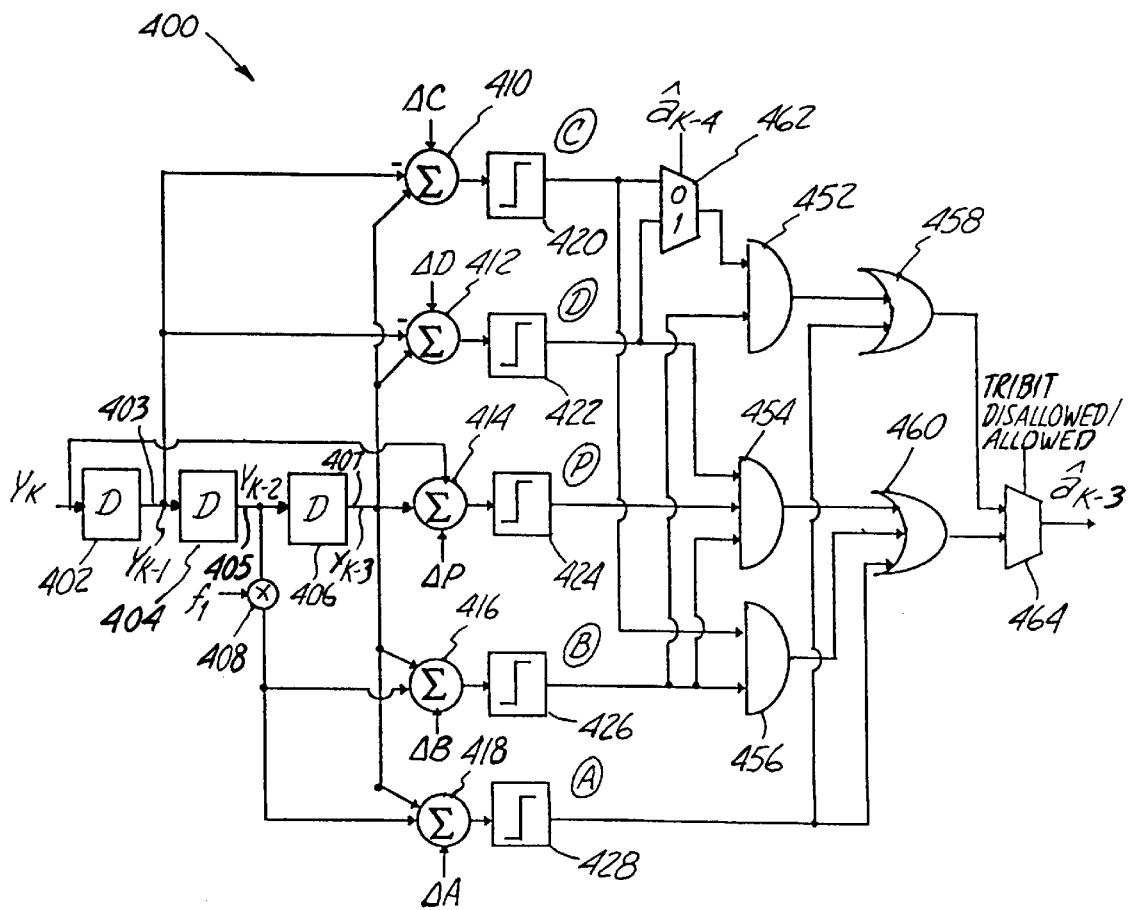
FIG. 8 is a block diagram showing the architecture of an embodiment of a 3D/4D signal space detector of the present invention.

In one embodiment of the present invention, the 3D/4D SSD is implemented using a full-rate detector 400 of FIG. 8.

Detector 400 includes delay operators 402, 404, and 406, multiplier 408, summing circuits 410, 412, 414, 416, and 418, slicers 420, 422, 424, 426, and 428, AND circuits 4592, 454, and 456, OR circuits 458 and 460, and muliplexers 462 and 464.

Delay operators 402, 404, and 406 are connected together in series and provide outputs 403, 405, and 407, respectively. Delay operator 402 receives $y_k$ at its input, so the series of delay operators 402, 404, and 406 provide $y_{k-1}$, $y_{k-2}$, and $y_{k-3}$ at their respective outputs 403, 405, and 407.

Multiplier 408 receives $f_1$ and $y_{k-2}$ at its inputs and produces the product of those two values at its output, which is connected to summing circuits 416 and 418.

In addition to receiving the output of multiplier 408, summing circuit 418 also receives $y_{k-3}$ and $\Delta A$. Summing circuit 418 adds its inputs together to produce an output that is provided to slicer 428, which produces a 1 if the sum is 0 or greater and 0 if the sum is less than 0. Together, summing circuit 418 and slicer 428 perform the function described by equation 40.

Summing circuit 416 receives the output of multiplier 408 along with $y_{k-3}$ and $\Delta B$. Summing circuit 416 provides the sum of its input values to slicer 426, which operates in a manner similar to slicer 428. Together, summing circuit 416 and slicer 426 perform the function described by equation 41.

Summing circuits 410 and 412 each receive $y_{k-1}$ and $y_{k-3}$. In addition, summing circuits 410 and 412 receive $\Delta C$ and $\Delta D$, respectively. Summing circuit 410 subtracts $y_{k-1}$ from $y_{k-3}$ plus $\Delta C$ to produce an output that is provided to slicer 420, which operates in a similar manner to slicers 426 and 428. Together, summing circuit 410 and slicer 420 perform the functions of equation 42. Summing circuit 412 subtracts $y_{k-1}$ from $y_{k-3}$ plus $\Delta D$ to produce an output that is provided to slicer 422, which operates in a manner similar to slicers 426 and 428. Together, summing circuit 412 and slicer 422 perform the functions of equation 43.

Summing circuit 414 receives $y_k$, $y_{k-3}$ and $\Delta P$, and provides their sum to slicer 424, which operates in a manner similar to slicer 426. Together, summing circuit 414 and slicer 424 perform the functions of equation 59.

The detection of data values during odd bit times is determined by AND circuit 452, OR circuit 458, and multiplexer 462, which together implement the logic of Equations 48 and 49. Multiplexer 462 passes either the output of slicer 420, representing location identifier C, or the output of slicer 422, representing location identifier D, based on the value of $â_{k-4}$. Specifically, when $â_{k-4}$ is 0 the output of slicer 420 is passed and when $â_{k-4}$ is 1 the output of slicer 422 is passed.

The output of multiplexer 462 is provided to AND circuit 452 along with the output of slicer 426, representing location identifier B. AND circuit 452 performs a logical AND operation on these input values and provides an output to OR circuit 458, which also receives the output of slicer 428, representing location identifier A. OR circuit 458 performs a logical OR operation on its two input values and provides its output to multiplexer 464, which passes the output value if the current value being detected is at a time interval that does not permit tribits.

AND circuits 454 and 456, OR circuit 460 and multiplexer 464 provide the detection logic needed during time intervals when tribits are allowed. Specifically, these components implement the function of Equation 60.

AND circuit 454 receives the output of slicers 422, 424, and 426, representing location identifiers D, P, and B, respectively and provides a logical AND output based on those inputs. AND circuit 456 receives the output of slicers 420 and 426, representing location identifiers C and D, respectively, and provides a logic AND output based on those inputs. The outputs of AND circuits 454 and 456 are received by OR circuit 460 along with the output from slicer 428, representing location identifier A. OR circuit 460 performs a logical OR operation on its inputs to produce an output that is passed by multiplexer 464 as the detected value if tribits are allowed.

In another embodiment of the 3D/4D SSD, the detector is implemented as a half-rate detector, capable of operating at twice the frequency of the input symbols. The block diagram architecture of such a detector is shown as detector 498 in FIG. 9.

Detector 498 has two inputs 500 and 502 that receive $y_k$ and $y_{k-1}$, respectively. Two delay circuits 504 and 506 delay the signals on inputs 500 and 502 for two time periods resulting in $y_{k-2}$ and $y_{k-1}$ on lines 508 and 510, respectively.

Lines 508 and 510 are connected to even-time period circuit 512, which includes multiplier 540, summing circuits 514, 516, 518, 520, and 522, slicers 524, 526, 528, 530, and 532, AND circuits 534 and 536, and OR circuit 538. Even-time period circuit 512 operates in a manner similar to the portions of detector 400 of FIG. 8 associated with the detection of even time period data values. Thus, AND circuits 534 and 536 and OR circuit 538 perform the same logical operation as AND circuits 454 and 456, and OR circuit 460 of detector 400. The output of even-time period circuit 512 is detected value $â_{k-4}$.

Figure 9:
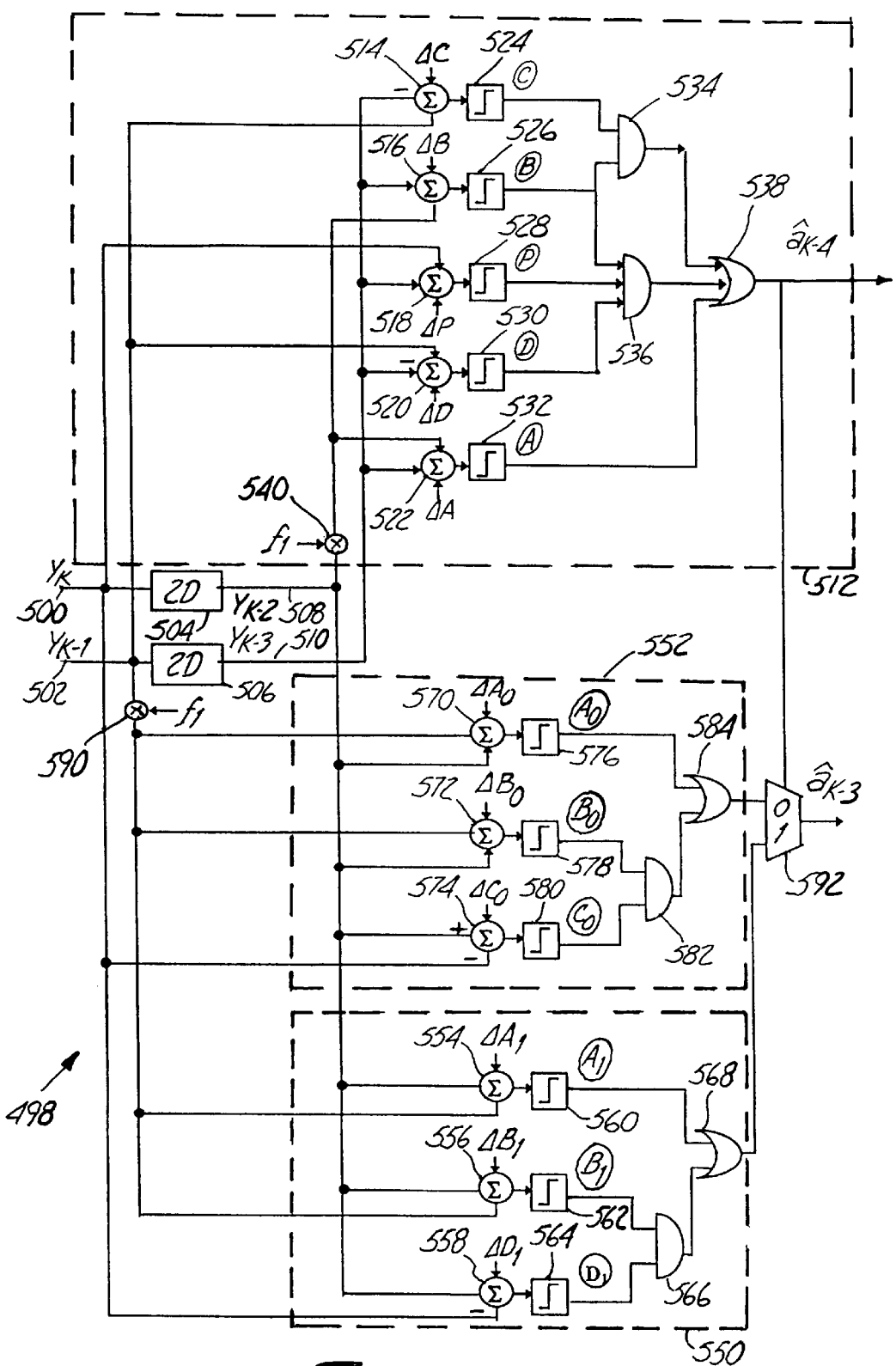
FIG. 9 is a block diagram showing the architecture of one embodiment of a half-rate 3D/4D signal space detector of the present invention.

Detector 498 of FIG. 9 also includes two odd-time period circuits 550 and 552, which perform the functions of Equations 49 and 48, respectively. Specifically, odd-time period circuit 550 includes summing circuits 554, 556, and 558, slicers 560, 562, and 564, AND circuit 566, and OR circuit 568 while odd-time period circuit 552 includes summing circuits 570, 572, and 574, slicers 576, 578, and 580, AND circuit 582, and OR circuit 584.

Summing circuits 570, 572, 554, and 556 add $Y_{k-2}$ to the product of $y_{-1}$ and $f_1$ produced by multiplier 590 and to $\Delta A_0$, $\Delta B_0, \Delta A_1$, and $\Delta B_1$, respectively. Summing circuits 574 and 558 subtract $y_k$ from the sum of $y_{k-2}$ and $\Delta C_0$ and $\Delta D_1$, respectively. $\Delta A_0$, $\Delta B_0$, and $\Delta C_0$ are equal to the value of equations 44, 45, and 46, respectively, with $â_{k-4}$ equal to 0. $\Delta A_1$, $\Delta B_1$, and $\Delta D_1$ are equal to the value of equations 44, 45, and 47, respectively, with $â_{k-4}$ equal to 1.

The output of summing circuits 570, 572, 574, 554, 556, and 558 are provided to slicers 576, 578, 580, 560, 562 and 564, respectively. Each of the slicers produces a +1 if the value at their respective input is 0 or greater, and 0 if the value at their respective input is less than 0.

The output of slicers 578 and 580 are provided to AND circuit 582, which performs a logical AND function on the two inputs. The output of AND circuit 582 is provided to OR circuit 584 along with the output of slicer 576. Or circuit 584 performs a logical OR operation on the two inputs to produce a possible detection output corresponding to equation 48.

The output of slicers 562 and 564 are provided to AND circuit 566, which performs a logical AND function on the two inputs. The output of AND circuit 566 is provided to OR circuit 568 along with the output of slicer 560. Or circuit 568 performs a logical OR operation on the two inputs to produce a possible detection output corresponding to equation 49.

Thus, odd-time period circuits 552 and 550 assume that $â_{k-4}$ is equal to 0 and 1, respectively, and calculate a possible detected value based on that assumption. This assumption is necessary in detector 498 because $a_{k-3}$ is being calculated before $a_{k-4}$ has been determined. Once $â_{k-4}$ has been determined by even-time period circuit 512, the value of $â_{k-4}$ is used to select the $â_{k-3}$ value that was calculated using the correct assumption for $â_{k-4}$. This selection is performed by multiplexer 592, which passes the $â_{k-3}$ value from odd-time period circuit 552 when $â_{k-4}$ is 0 and passes the $â_{k-3}$ value from odd-time period circuit 550 when $a_{k-4}$ is 1.

Thus, it can be seen that the present invention implements a signal space detector for MTR-coded channels. Since no constraint is enforced on the channel response, the detectors can be used over a wide user density range. Also, signal space detector is implemented in accordance with the present invention with an MTR=2 constraint as well as time-variant MTR codes. With the MTR=2 code, the detector provides a significant gain over the 3D-110 detector at lower user densities. The performance is further improved with a time variant MTR code of higher rate, especially at higher densities.

The present invention provides a detector 400 in a disc drive 110 that includes a first detector portion 462, 452, 458 configured to determine the location of a sample vector, $y_{k-3}$, $y_{k-2}$, $y_{k-1}$, in a first signal space $y'''_{k-3}$, $y''_{k-2}$, $y'_{k-1}$. The detector 400 also includes a second detector portion 454, 456, 460, 464 configured to determine the location of a second sample vector $y_{k-3}$, $y_{k-2}$, $y_{k-1}$, $y_k$, in a second signal space $y'''_{k-3}$, $y''_{k-2}$, $y'_{k-1}$, $y_k$. The determination is made using a logic statement, equation 60, to combine a plurality of location indicators A, B, C, D and P. Each location indicator provides a location, 0 or 1, of the second sample vector relative to a respective boundary surface, A, B, C, D, or P. The logic statement and the location identifiers are independent of the values of other location identifiers.

The present invention is also implemented as a method. The method includes determining at least two location identifiers A, B, C, and D that indicate the location of a sample vector a location of a sample vector $y_{k-3}$, $y_{k-2}$, $y_{k-1}$, relative to a respective boundary A, B, C, and D, in a first signal space $y'''_{k-3}$, $y''_{k-2}$, $y'_{k-1}$. A first data value $â_{k-3}$ is then determined based on the location indicators. At least two additional location identifiers A, B, C, D, and P are determined where each additional location identifier indicates the location of a second sample vector $y_{k-3}$, $y_{k-2}$, $y_{k-1}$, $y_k$, relative to respective boundary surfaces A, B, C, D, and P, in a second signal space $y'''_{k-3}$, $y''_{k-2}$, $y'_{k-1}$, $y_k$. A second data value $â_{k-3}$ is then determined by combining the additional location identifiers using a decision equation, Equation 60. The format of decision equation 60 is independent of the values of the additional location identifiers.

The present invention can also be implemented as a signal space detector configured to perform the above-mentioned steps.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular partial response target and MTR code while maintaining substantially the same functionality without departing from the scope and spirit of the present invention.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the detection system while maintaining substantially the same functionality without departing from the scope and spirit of the present invention. In addition, although the preferred embodiment described herein is directed to a signal space detector for a disc drive system, it will be appreciated by those skilled in the art that the teachings of the present invention can be applied to other systems, like tape drive, optical drive, or magneto-optical drive systems, without departing from the scope and spirit of the present invention.

What is claimed is:

1. A detector in a disc drive for detecting data values by using sample vectors that are formed from respective pluralities of temporally separated data samples, the detector comprising:

a first detector portion configured to detect a first data value by determining the location of a first sample vector in a first signal space; and a second detector portion configured to detect a second data value by determining the location of a second sample vector in a second signal space, the determination made by using a logic statement to combine a plurality of location indicators, each location indicator providing a location of the second sample vector relative to a respective boundary surface, the logic statement and the values of location indicators being independent of the values of other location indicators.

2. The detector of claim 1 wherein the first signal space has (N−1) coordinates and the second signal space has N coordinates.

3. The detector of claim 1 wherein the data samples are based on input values that were encoded using a time-varying maximum transition run constraint that varies between a first constraint and a second constraint over a plurality of time intervals.

4. The detector of claim 3 wherein the first detector portion detects data values corresponding to input values that were encoded under the first constraint and the second detector portion detects data values corresponding to input values that were encoded under the second constraint.

5. The detector of claim 1 wherein the first detector portion determines the location of the first sample vector by using a plurality of location indicators, each location indicator providing a location of the first sample vector relative to a respective boundary surface.

6. The detector of claim 5 wherein at least one boundary surface is used by both the first detector portion and the second detector portion.

7. The detector of claim 6 wherein all of the boundary surfaces used by the first detector portion are used by the second detector portion and wherein the second detector portion uses an additional boundary surface.

8. The detector of claim 7 wherein the location indicator associated with the additional boundary is determined in part based on a coordinate in the second signal space that is not present in the first signal space.

9. The detector of claim 1 wherein the location indicators are one of a first value and a second value, the first value indicating that the sample vector is on a first side of the respective boundary surface and the second value indicating that the sample vector is on a second side of the respective boundary surface.

10. A method of detecting data values based on a sampled read signal read from a disc in a disc drive, the sampled read signal including data samples provided in a plurality of time intervals, the method comprising steps of:
  (a) determining at least two location identifiers, each location identifier indicating the location of a sample vector relative to respective boundary surfaces in a first signal space;
  (b) determining a first data value based on the location identifiers;
  (c) determining at least two additional location identifiers, each additional location identifier indicating the location of a second sample vector relative to respective boundary surfaces in a second signal space; and
  (d) determining a second data value by combining the additional location identifiers using a decision equation, the format of the decision equation being independent of the value of the additional location identifiers.

11. The method of claim 10 wherein the values of each of the additional location identifiers are independent of each other.

12. The method of claim 10 wherein the second signal space comprises four coordinates and the first signal space comprises three coordinates.

13. The method of claim 12 wherein the sample vector comprises three temporally separated data samples and the second sample vector comprises four temporally separated data samples.

14. The method of claim 13 wherein the four coordinates of the second signal space comprise $(a_k + f_1 a_{k-1} + f_2 a_{k-2} + f_3 a_{k-3})$, $(a_{k-1} + f_1 a_{k-2} + f_2 a_{k-3})$, $(a_{k-2} + f_1 a_{k-3})$, and $(a_{k-3})$ where $a_k$ is the kth input value and $f_1$, $f_2$, and $f_3$ are proportionality constants.

15. The method of claim 14 wherein the three coordinates of the first signal space comprise $(a_{k-1} + f_1 a_{k-2} + f_2 a_{k-3})$, $(a_{k-2} + f_1 a_{k-3})$, and $(a_{k-3})$.

16. The method of claim 15 wherein the second sample vector comprises four samples comprising respectively $(a_{k+f1} a_{k-1} + f_2 a_{k-2} + f_3 a_{k-3})$, $(a_{k-1} + f_1 a_{k-2} + f_2 a_{k-3} + f_3 \hat{a}_{k-4})$, $(a_{k-2} + f_1 a_{k-3} + f_2 \hat{a}_{k-4} + f_3 \hat{a}_{k-5})$, and $(a_{k-3} + f_1 \hat{a}_{k-4} + f_2 \hat{a}_{k-5} + f_3 \hat{a}_{k-6})$.

17. The method of claim 10 wherein there are five boundary surfaces in the second signal space.

18. The method of claim 10 wherein the read signal is based on input values that have been encoded using a time-varying maximum transition run constraint that varies between a first constraint and a second constraint periodically over a plurality of time intervals.

19. The method of claim 10 wherein steps (a) and (c) occur at the same time.

20. A detector for detecting data read from a disc in a disc drive and provided as a sampled read signal including data samples in a plurality of time intervals, comprising:
  a receiver configured to receive the data samples; and
  detection means, coupled to the receiver, for detecting the data encoded according to a code having a time-varying maximum transition run constraint by identifying the location of a data sample in a signal space.

21. The detector of claim 20 wherein the detection means comprises:
  a first detector portion that identifies the location of a first data sample in a first signal space; and
  a second detector portion that identifies the location of a second data sample in a second signal space.

22. The detector of claim 21 wherein the first signal space has (N−1) coordinates and the second signal space has N coordinates.

23. The detector of claim 21 wherein the detector means identifies the location of the first data sample relative to a boundary surface in the first signal space.

24. The detector of claim 23 wherein the detector means identifies the location of the second data sample relative to a boundary surface in the second signal space.

\* \* \* \* \*

UNITED STATES PATENT AND TRADEMARK OFFICE
CERTIFICATE OF CORRECTION

PATENT NO. : 6,404,573 B1
DATED : June 11, 2002
INVENTOR(S) : Rub et al.

It is certified that error appears in the above-identified patent and that said Letters Patent is hereby corrected as shown below:

<u>Title page,</u>
Item [56], References Cited, U.S. PATENT DOCUMENTS,
-- 5,321,559    06/1994    Nguyen et al. .........................360/46 --
OTHER PUBLICATIONS,
--"Signal Space Detectors for MTR-Coded Magnetic Recording Channels", by Hamid Shafiee et al., June 16, 1997

"On The Use of Decision Feedback for Simplifying the Viterbi Detector", by J.W. M. Bergmann et al., Phillips Journal of Research, Vol. 42, No. 4, pp. 399-428, 1987

"Performance Data for a Six-Sample Look-Ahead (1,7) ML Detection Channel", by A. Patel et al. IEEE Transaction on Magnetics, Vol. 29, No. 6, pp. 4012-4014, Nov. 1993.

"A High Dimensional Signal Space Implementation of FDTS/DF", by B. Brickner et al. IEEE Transactions on Magnetics, Vol. 32, No. 5, pp. 3941-3943, Sep. 1996.

"A Low-Power Analog Sampled-Data VLSI Architecture for Equalization and FDTS/DF Detection", by L. Carley et al., IEEE Transactions on Magnetics, Vol. 31, No. 2, pp. 1202-1207, March 1995.

"Design of a Rate 5/6 Maximum Transition Run Code", by B. Brickner et al. Digest of Intermag p. CR-17, 1997

"High Data Rate Detection for 3D-110 Channels", by B. Brickne et al. Digest of Intermag p. CR-17, 1997

"A 1,7 Code EEPR4 Read Channel IC with Analog Noise Whitened Detector", by R. Yamasaki et al., International Solid-State Circuit Conference (ISSCC), 1997, pp. 316-317.--

<u>Column 8,</u>
Equation 18 should read -- $\Delta B = (-f_1 - f_1 f_2) \hat{a}_{k-3} - f_2 \hat{a}_{k-4} - f_1$ --
Equation 19 should read -- $\Delta E = (-f_1 +1) \hat{a}_{k-3} - f_2 \hat{a}_{k-4}$ --

<u>Column 10,</u>
Equation 33 should read -- $y_{k-3} = a_{k-3} + f_1 \hat{a}_{k-4} + f_2 \hat{a}_{k-5} + f_3 \hat{a}_{k-6}$ --

<u>Column 11,</u>
Equation 34 should read -- $y'_{k-1} = a_{k-1} + f_1 a_{k-2} + f_2 a_{k-3}$ --
Equation 39 should read -- $y'''_{k-3} = y_{k-3} - f_1 \hat{a}_{k-4} - f_2 \hat{a}_{k-5} - f_3 \hat{a}_{k-6}$ --
Equation 49 should read -- $\hat{a}_{k-3} = A + B \cdot D$ when $\hat{a}_{k-4} = +1$ --

UNITED STATES PATENT AND TRADEMARK OFFICE
CERTIFICATE OF CORRECTION

PATENT NO. : 6,404,573 B1
DATED : June 11, 2002
INVENTOR(S) : Rub et al.

It is certified that error appears in the above-identified patent and that said Letters Patent is hereby corrected as shown below:

<u>Column 12,</u>
Equation 56 should read -- $y_{k-3} + (1 + f_1 - f_2 + f_3) y_k - f_1 \hat{a}_{k-4} - f_2 \hat{a}_{k-5} - f_3 \hat{a}_{k-6} = 0$ --

<u>Column 18,</u>
Line 3, after "respectively" replace
"$(a_k + f_1 a_{k-1} + f_2 a_{k-2} + f_3 a_{k-3}), (a_{k-1} + f_1 a_{k-2} + f_2 a_{k-3} + f_3 \hat{a}_{k-4}), (a_{k-2} + f_1 a_{k-3} + f_2 \hat{a}_{k-4} + f_3 \hat{a}_{k-5}),$ and $(a_{k-3} + f_1 \hat{a}_{k-4} + f_2 \hat{a}_{k-5} + f_3 \hat{a}_{k-6})$" with -- $(a_k + f_1 a_{k-1} + f_2 a_{k-2} + f_3 a_{k-3}), (a_{k-1} + f_1 a_{k-2} + f_2 a_{k-3} + f_3 \hat{a}_{k-4}), (a_{k-2} + f_1 a_{k-3} + f_2 \hat{a}_{k-4} + f_3 \hat{a}_{k-5}),$ and $(a_{k-3} + f_1 \hat{a}_{k-4} + f_2 \hat{a}_{k-5} + f_3 \hat{a}_{k-6})$ -- .

Signed and Sealed this

Thirteenth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,404,573 B1
DATED : June 11, 2002
INVENTOR(S) : Rub et al.

It is certified that error appears in the above-identified patent and that said Letters Patent is hereby corrected as shown below:

<u>Column 8,</u>
Equation 12 should read:
-- $E: \text{sgn}(y''_{k-2} - (f_1 - f_2) y_k + (f_1 - f_2) â_{k-3})$ --

<u>Column 11,</u>
Equation 42 should read: -- $C: \text{sgn}(y_{k-3} - y_{k-1} + \Delta C)$ --

Signed and Sealed this

Twenty-sixth Day of October, 2004

JON W. DUDAS
*Director of the United States Patent and Trademark Office*